(12) United States Patent
Richards

(10) Patent No.: US 6,581,080 B1
(45) Date of Patent: Jun. 17, 2003

(54) DIGITAL FILTERS

(75) Inventor: David Richards, Stockbridge (GB)

(73) Assignee: Sony United Kingdom Limited, Weybridge (GB)

( * ) Notice: Subject to any disclaimer, the term of this patent is extended or adjusted under 35 U.S.C. 154(b) by 0 days.

(21) Appl. No.: 09/549,403

(22) Filed: Apr. 14, 2000

(30) Foreign Application Priority Data

Apr. 16, 1999 (GB) .............................................. 9908810
Apr. 16, 1999 (GB) .............................................. 9908813

(51) Int. Cl.[7] .............................................. G06F 17/10
(52) U.S. Cl. ........................ 708/320; 708/300; 708/323
(58) Field of Search ................................. 708/320, 323, 708/300

(56) References Cited

U.S. PATENT DOCUMENTS

| | | | | |
|---|---|---|---|---|
| 5,768,313 A | * | 6/1998 | Kuribayashi | ................. 375/229 |
| 5,790,440 A | * | 8/1998 | Fujii et al. | .................. 708/322 |
| 5,856,934 A | | 1/1999 | Nakajima et al. | ..... 364/724.011 |
| 5,903,481 A | * | 5/1999 | Kondo et al. | ................ 708/100 |
| 6,119,048 A | * | 9/2000 | Kondo et al. | ................. 700/39 |

FOREIGN PATENT DOCUMENTS

| | | |
|---|---|---|
| EP | 0 196 413 | 10/1985 |
| GB | 2 080 068 | 1/1982 |
| GB | 2 260 068 A | 3/1993 |
| GB | 2 267 619 A | 12/1993 |

\* cited by examiner

*Primary Examiner*—David H. Malzahn
(74) *Attorney, Agent, or Firm*—Frommer Lawrence & Haug LLP; William S. Frommer; Dennis M. Smid

(57) ABSTRACT

A technique for generating coefficients for a digital filter. A gain control signal with a value of reference gain and a frequency control signal with a value of reference frequency are provided. A plurality of gain and/or frequency points are calculated, according to a model of the frequency/gain characteristic of a prototype analog filter, at frequencies equal to and less than a Nyquist frequency (where the Nyquist frequency is half the sampling frequency of the digital frequency) and which match corresponds to gain and/or frequency points in the corresponding digital filter characteristic. Pre-warped parameters of a model of the analogue filter are calculated from the calculating points and a transform is applied to the resulting pre-warped analogue model, thus, converting the pre-warped analog model into the digital domain. Coefficients from the transformed model are generated and applied to the filter, thereby generating the coefficients of the digital filter.

55 Claims, 10 Drawing Sheets

Fig. 1  Warping effect of bilinear transform
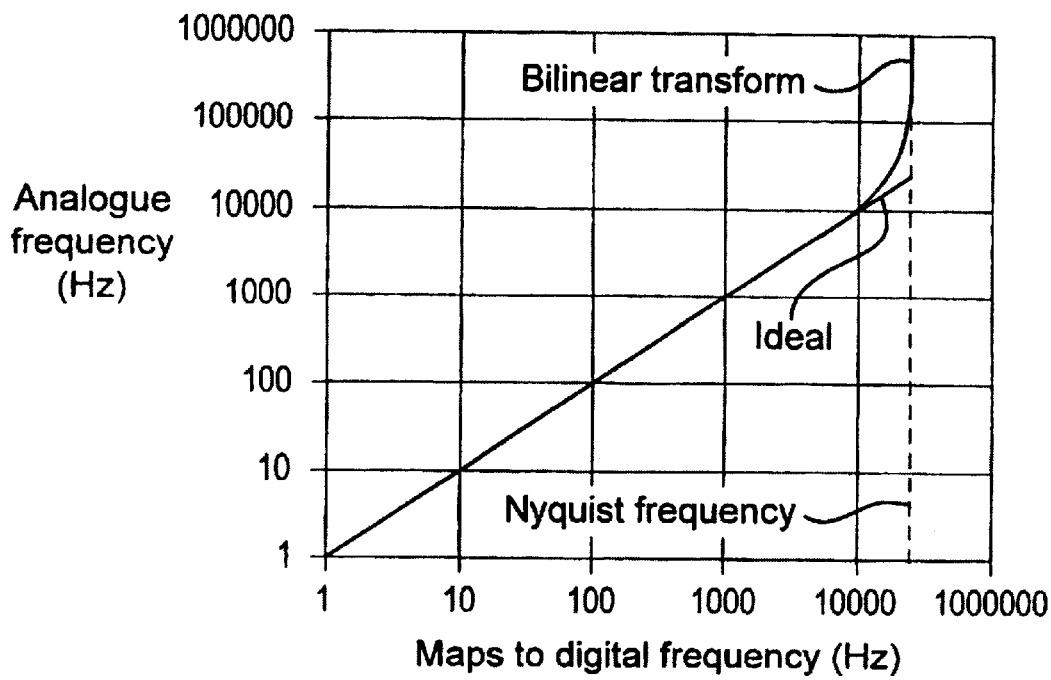
(PRIOR ART)
Fig. 2  Comparison of shelves
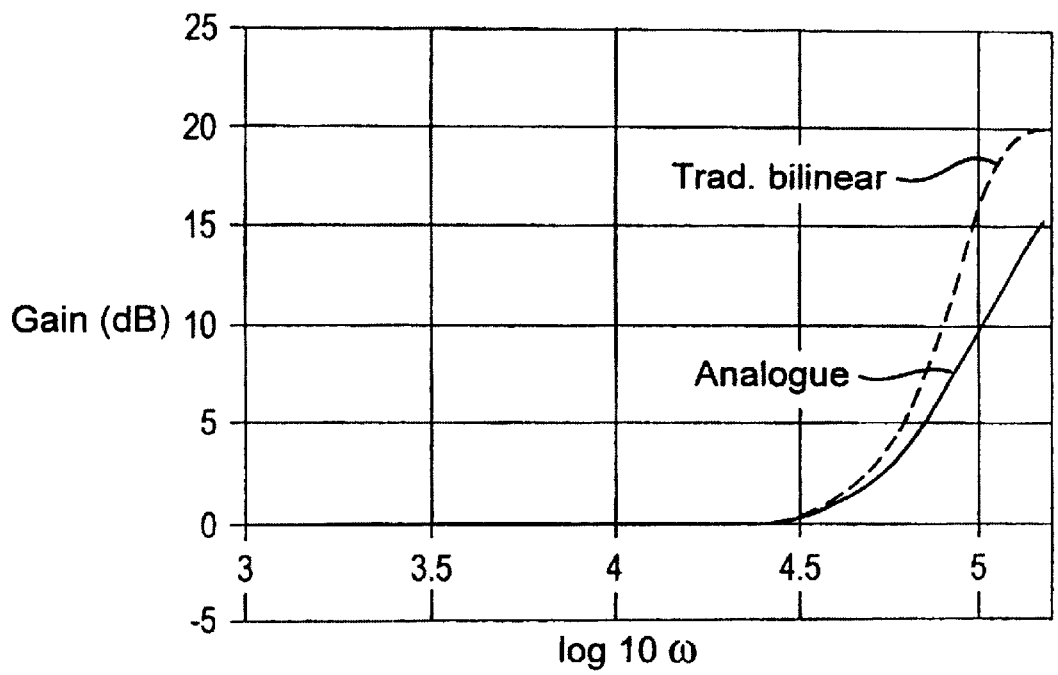

(PRIOR ART)

*Fig. 5*  *Orfanidis matching scheme*
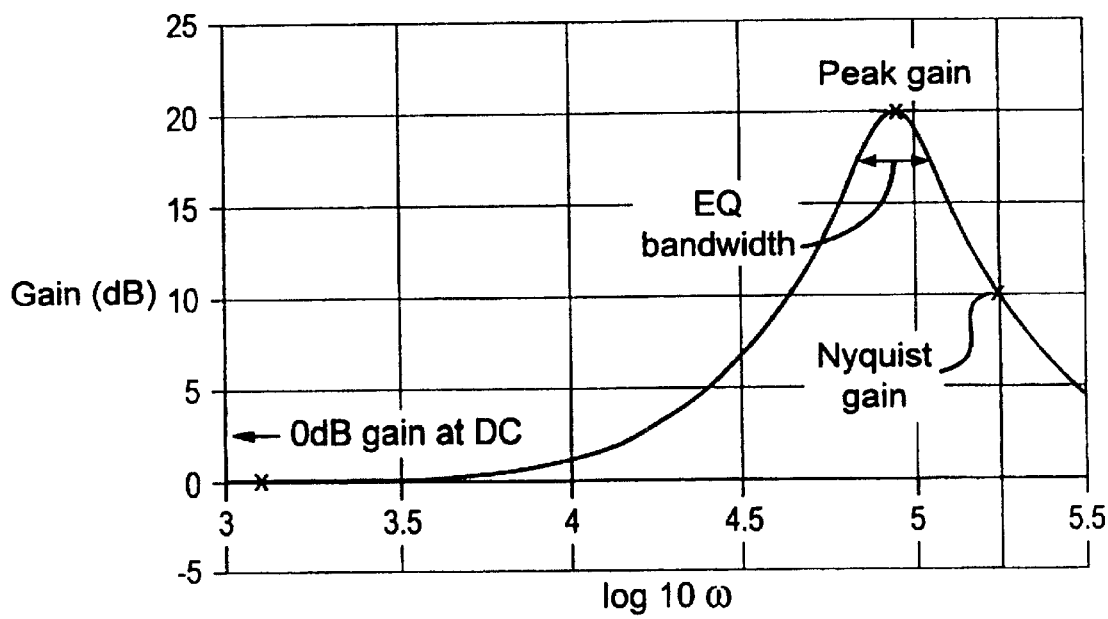
(PRIOR ART)
*Fig. 6*
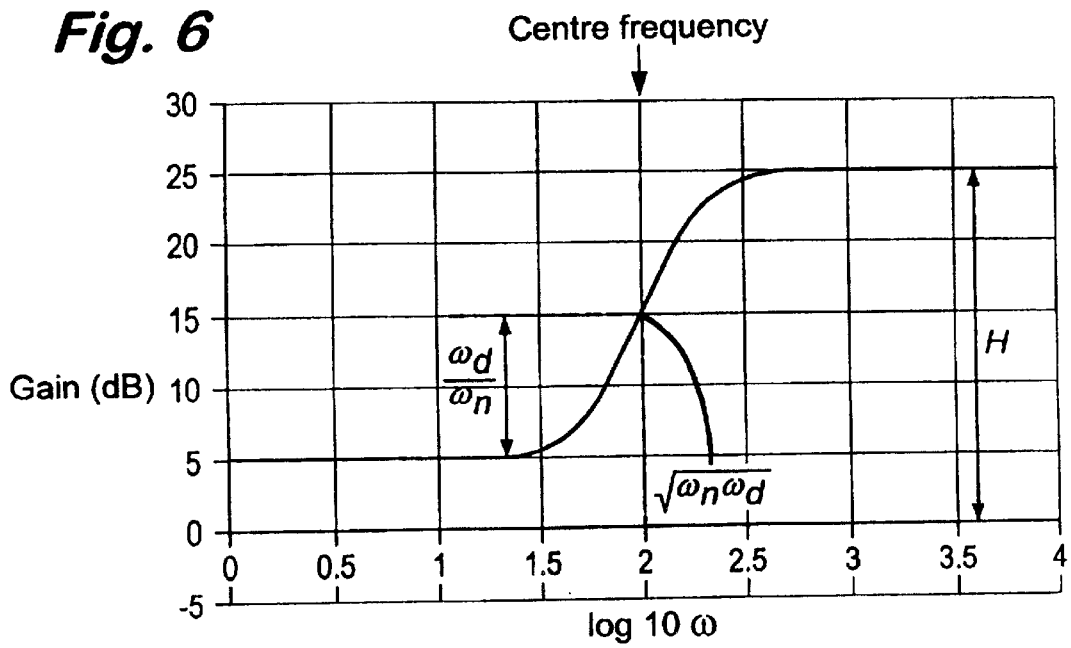

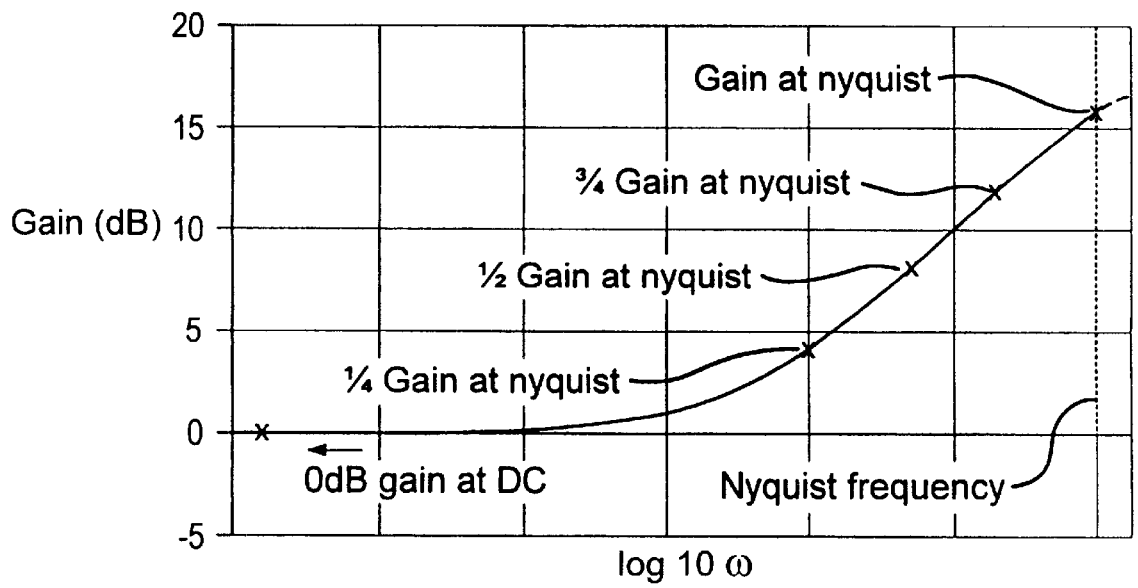
Fig. 7  Convenient match points
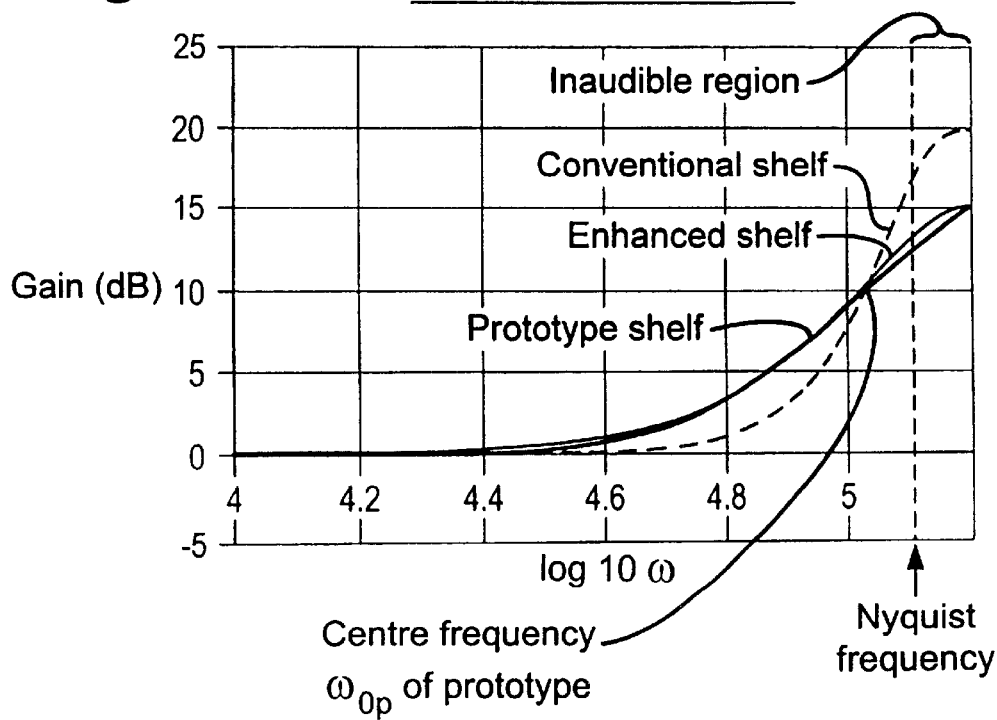
Fig. 8  Comparison of shelves

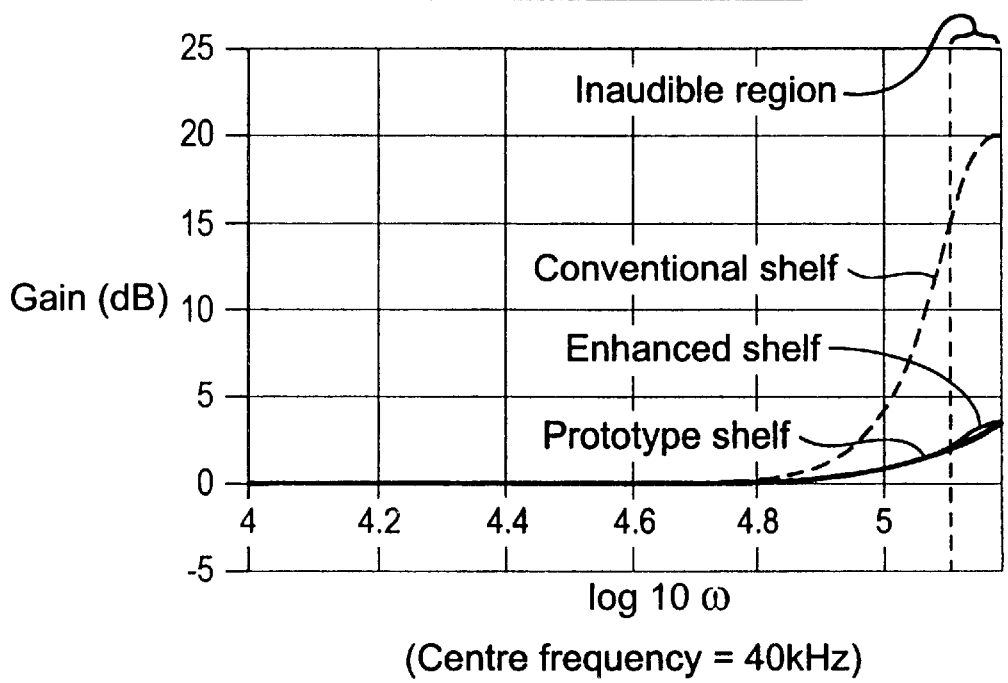
Fig. 9  Comparison of shelves
(Centre frequency = 40kHz)
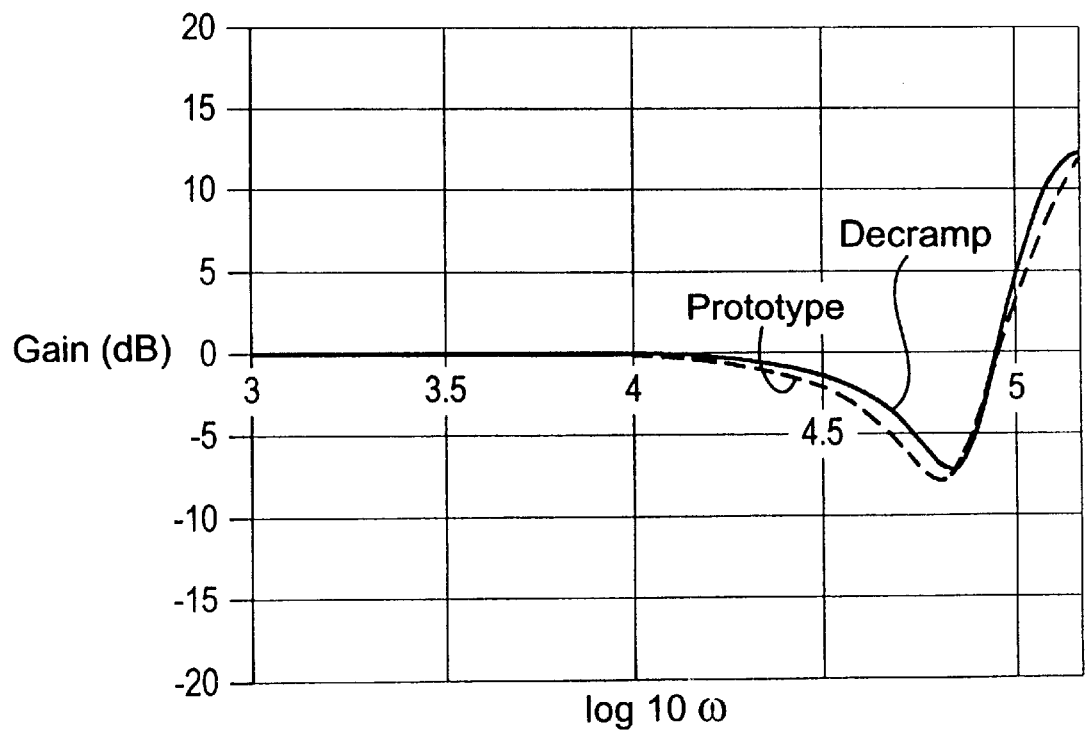
Fig. 10

Shelf Generation

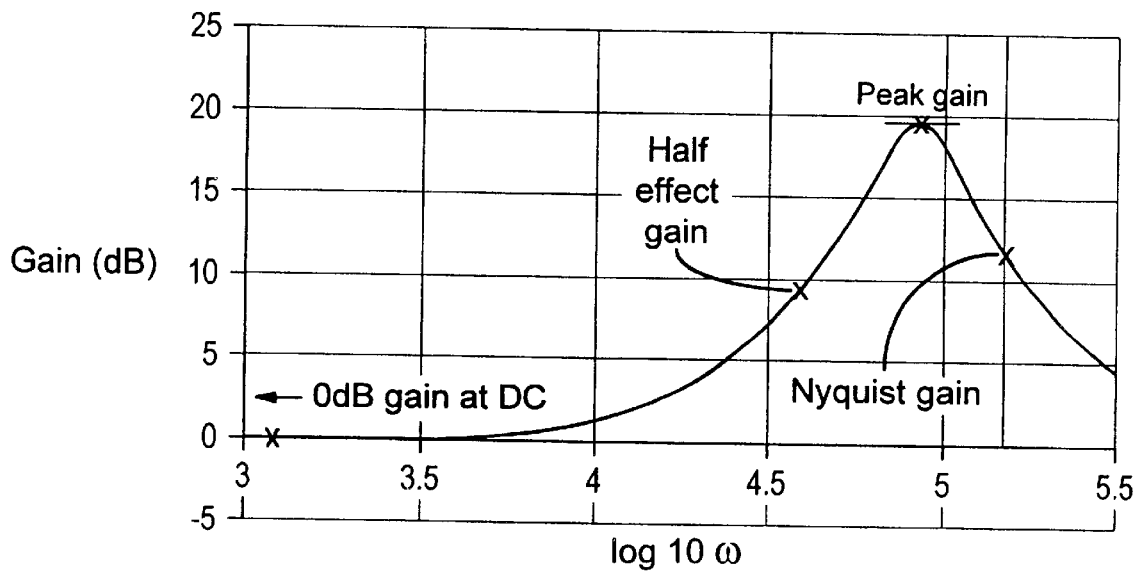
*Fig. 14*  Proposed matching scheme
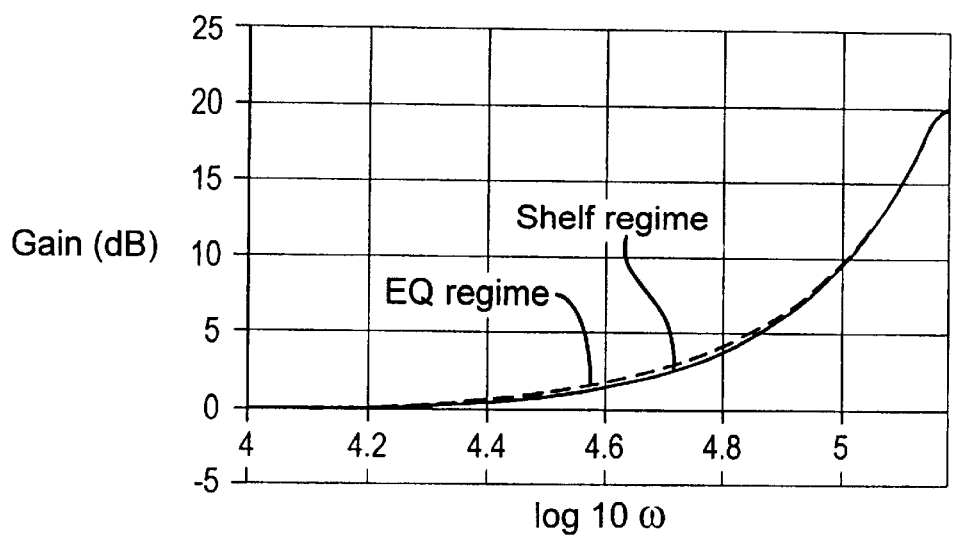
*Fig. 15*  Crossover between regimes EQ Generation

DIGITAL FILTERS

BACKGROUND OF THE INVENTION

1. Field of the Invention

The present invention relates to digital filters, a method of generating coefficients in a digital filter system and a data carrier.

In this specification the term "algorithmically stable" and its inverse, instability is used. It refers to situations in which the solution to an equation becomes very sensitive to small changes in input parameters. The terms "stability", "stable" and the inverses refer to such algorithmic stability and its inverse.

2. Description of the Prior Art

Background to one aspect of the present invention will now be described by way of example with reference to FIGS. 4 and 5 which are graphs showing frequency responses of illustrative filters.

It is known to provide, for example, an equalisation characteristic or EQ as shown for example in FIGS. 4 and 5. Such a characteristic can be shifted in frequency such that its peak is adjacent to the Nyquist frequency, which is half the sampling frequency of the digital filter. It is also known that currently available coefficient calculation algorithms become ill-conditioned under these conditions as will be explained hereinafter. It is desired to provide an EQ where the peak is at or even apparently beyond the Nyquist frequency.

Whilst the background to the invention has been described with reference to an EQ, the invention is not limited to EQ but may be applicable to other filter characteristics which become unstable when a portion of the characteristic is near to and/or beyond Nyquist frequency.

SUMMARY OF ASPECTS OF THE INVENTION

According to the one aspect present invention, there is provided a digital filter system, which generates a first filter characteristic which is liable to instability when a portion thereof reaches a reference frequency and which generates a second filter characteristic when the said portion of the first filter characteristic approaches its frequency zone of instability, and which second filter characteristic, substantially matches a predetermined portion of the first characteristic and is stable in the frequency zone of instability of the first characteristic.

Thus, this aspect of the invention replaces the portion below Nyquist frequency of the characteristic with a different filter characteristic which is algorithmically stable and yet which substantially matches the said portion below Nyquist frequency of the unstable characteristic. The algorithmically stable filter characteristics can be shifted to higher frequencies giving the appearance that the original EQ is operating correctly in what is in fact its region of instability.

For the example of an EQ, when the peak reaches Nyquist frequency, the portion of the EQ below Nyquist frequency resembles a portion of a shelf. In a preferred embodiment of the invention, the portion of the EQ below Nyquist frequency is replaced by a matching shelf.

According to another aspect of the invention, there is provided method of generating coefficients in a digital filter to emulate an equalisation characteristic, comprising the steps of:

(a) providing a gain control signal setting a value of peak gain G;

(b) providing a frequency control signal setting a value of centre frequency (c) calculating, according to a model of the frequency/gain characteristic of a prototype analogue equalisation characteristic, Nyquist gain Hn, and lower half effect frequency $\omega_1$ and which match corresponding gain and/or frequency points in the corresponding digital filter characteristic, (d) calculating pre-warped values $\omega_{cw}$, $\omega_{1w}$ of $\omega_c$ and $\omega_1$, (e) calculating from Hn, G, $\omega_{cw}$, and $\omega_{1w}$ a pre-warped model of the digital filter characteristic;

(f) applying a transform to the resulting pre-warped analogue model to convert the pre-warped analogue model to the digital domain and (g) generating filter coefficients from the transformed model and applying them to the filter.

Thus there is provided an EQ characteristic which is digitally emulated and has algorithmic stability in the Nyquist region.

Another embodiment of the invention seeks to provide a shelf digital filter which is empirically optimised to provide a good gain match in the Nyquist range with a prototype analogue filter. Another embodiment of the invention seeks to provide such a shelf which is a good match to a shelf like portion of an analogue equalisation characteristic.

According to a further aspect of the present invention, there is provided a method of generating coefficients in a digital filter, comprising the steps of:

(a) providing a gain control signal setting a value of reference gain, (b) providing a frequency control signal setting a value of reference frequency (c) calculating, according to a model of the frequency/gain characteristic of a prototype analogue filter, a plurality of gain and/or frequency points at frequencies equal to and less than Nyquist frequency (where Nyquist frequency is half the sampling frequency of the digital filter) and which match corresponding gain and/or frequency points in the corresponding digital filter characteristic, (d) calculating from the said calculated points, pre-warped parameters of a model of the analogue filter, (e) applying a transform to the resulting pre-warped analogue model to convert the pre-warped analogue model to the digital domain and (f) generating filter coefficients from the transformed model and applying them to the filter.

In one embodiment of the invention, the analogue filter is a symmetrical shelf. In another embodiment, the analogue filter is a shelf like portion of an Equalisation characteristic.

The inventive method provides a good match in the digital domain to the desired analogue filter characteristics and maintains algorithmic stability even in the Nyquist range and allows the Equalisation characteristic to appear to have a peak beyond Nyquist frequency.

These and other aspects of the invention are specified in the claims to which attention is invited.

BRIEF DESCRIPTION OF THE DRAWINGS

The above and other objects, features, and advantages of the invention, will be apparent from the following detailed description of illustrative embodiments, which is to be read in conjunction with the accompanying drawings in which:

FIGS. 1 to 5 are filter characteristics;

FIG. 6 is a shelf characteristic illustrating some parameters thereof;

FIG. 7 shows illustrative match points in a shelf;

FIG. 8 compares a prototype shelf with a "conventional shelf" and a shelf (enhanced shelf) according to the invention;

FIG. 9 shows a shelf where the centre frequency is above the Nyquist range;

FIGS. 10 and 11 show overshoot characteristics;

FIG. 14 shows an Equalisation (EQ) characteristic and matching points;

FIG. 15 shows matching of a shelf with an EQ;

DESCRIPTION OF THE PREFERRED EMBODIMENTS

Bilinear Transform—Prior Art

Direct digital filter design is difficult to achieve. The usual way to construct a digital filter is to start from an analogue filter (s-plane) and then use the bilinear transform to convert to the digital domain (z-plane). The bilinear transform takes the form:

$$s = 2F_s 1 - \frac{z^{-1}}{1+z^{-1}} \quad \text{(Equation 1)}$$

where: $F_s$ is the sampling frequency.

However, this maps the entire frequency range (dc to infinite frequency) of the analogue filter into the range dc to maximum representable frequency (Nyquist frequency) of the digital filter. The mapping is not linear but instead has a characteristic as shown in FIG. 1.

The relationship between 'analogue frequency', $\omega_s$, and 'digital frequency', $\omega_d$ is known and given by:

$$\frac{\omega_s}{2F_s} = \tan\frac{\omega_d}{2F_s} \quad \text{(Equation 2)}$$

where:

$\omega_s$ is "analogue frequency";

$\omega_d$ is "digital frequency"; and $F_s$ is the sampling frequency.

If no action is taken to remedy this warping behaviour then the results are often unsatisfactory.

Shelf—Prior Art

Take as an example an analogue 'shelf' filter characteristic with a centre frequency of 16 kHz and boost of 20 dB, as shown in FIG. 2. Such a filter characteristic is known in the art as a "shelf".

The following equation represents a general second order prototype shelf:

$$shelf = \frac{H_{\infty p}\left(s^2 + s\frac{\omega_{np}}{Q_{np}} + \omega_{np}^2\right)}{s^2 + s\frac{\omega_{dp}}{Q_{dp}} + \omega_{dp}^2} \quad \text{(Equation 3)}$$

where:

$\omega_{np}$ is a zero frequency;

$\omega_{dp}$ is a pole frequency;

$Q_{np}$ is a measure of zero damping;

$Q_{dp}$ is a measure of pole damping;

$H_{\infty p}$ is Gain at infinity (reference frequency);

the Q components ($Q_{np}$, and $Q_{dp}$) do not correspond directly to any features of the response; and the centre frequency is at $\sqrt{\omega_{dp}\omega_{np}}$ if, and only if, $Q_{np} = Q_{dp}$.

Subscript p denotes prototype.

It can be seen that, if the equation 3 is simply subjected to the bilinear transform, then the new digital filter has its centre frequency at 12.6 kHz and the transition is steeper than desired. It has very little in common with the ideal response.

Figure 3:
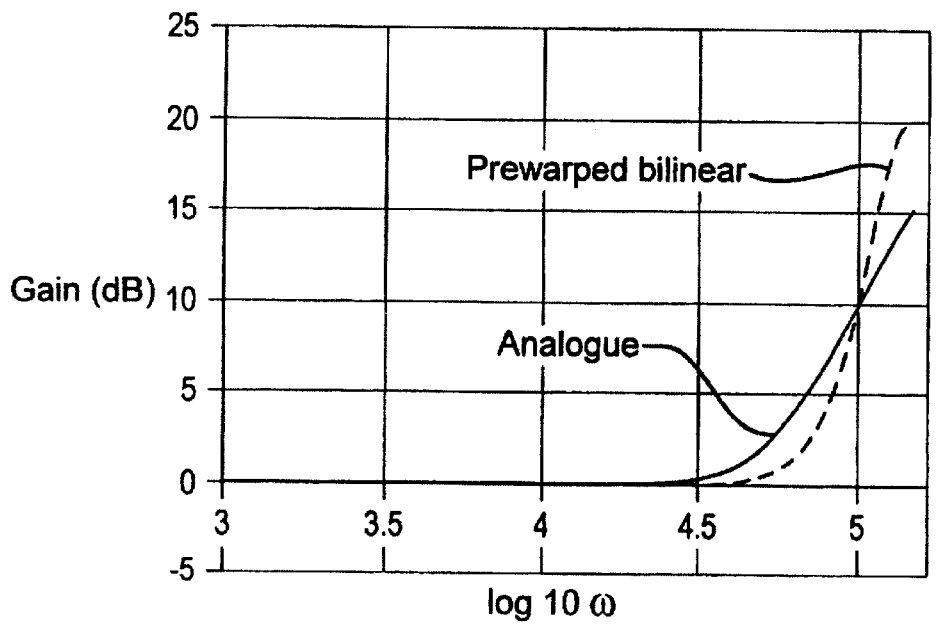

To counteract this, it is conventional to 'pre-warp' the shelf. This involves moving the centre frequency in the analogue domain such that, when it is warped by the transform (as per the relationship given in Equation 2), it ends up at the correct frequency. The resulting filter would be similar to what is shown in FIG. 3.

It can be seen that, while the shelf now has the correct centre frequency, it is very much sharper than the analogue prototype.

EQ—Prior Art

Figure 4:
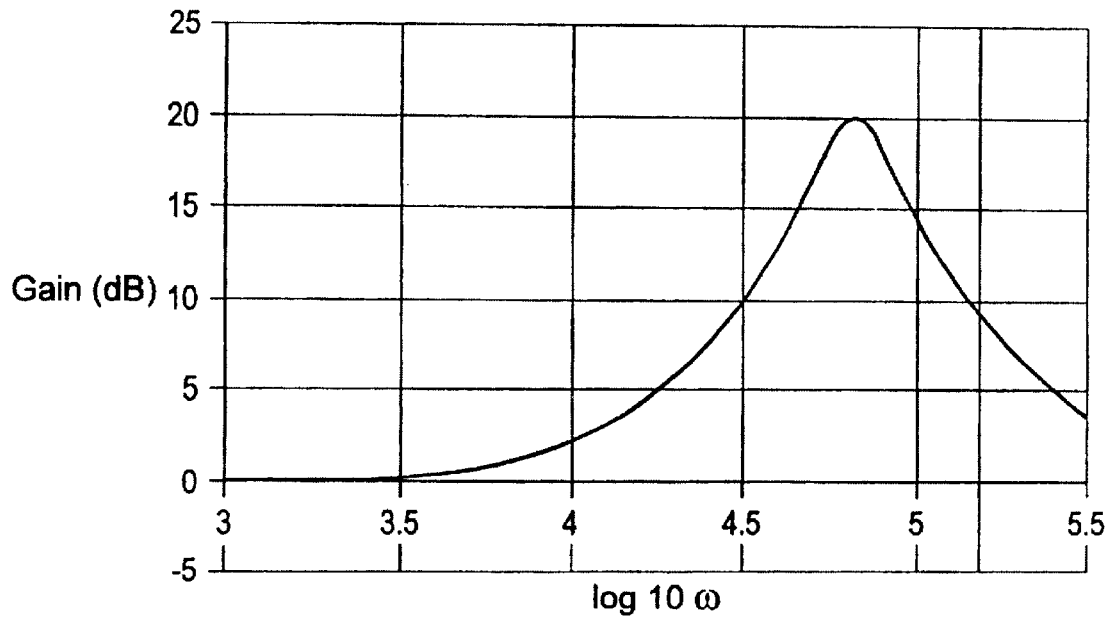

It is also known to produce a characteristic such as that shown in FIG. 4 known as an equalisation characteristic or EQ.

A prototype EQ has the transfer function in the analogue (s) domain:

$$H_p(s) = \frac{s^2 + G_p\frac{\omega_{cp}}{Q_p}s + \omega_{cp}^2}{s^2 + \frac{\omega_{cp}}{Q_p}s + \omega_{cp}^2} \quad \text{(Equation 4)}$$

where:

$G_p$ is gain, $\omega_{cp}$ is the centre frequency of the response; and $Q_p$ is the quality factor of the filter.

Subscript p denotes prototype.

The transfer function is transformed to the digital (z) domain using the bilinear transform of Equation 1. The transform is applied to a pre-warped EQ as described above with reference to a shelf. To warp the EQ, it is known to use a technique known as the Orfanidis method (Digital Equaliser with prescribed Nyquist Frequency Gain, Orfanidis, Audio Eng. Soc. Vol. 45 p444, June 1997.) which seeks to match the features of peak gain, Nyquist gain and EQ bandwidth at a known gain in the prototype EQ to the same features in the transformed EQ. FIG. 5 shows these features.

Embodiments of the Present Invention

Embodiments of the present invention provide digital filters which have a good match with prototype analogue filters in the Nyquist range and are algorithmically stable in the Nyquist range.

The good match and the stability are provided by selecting features of the prototype analogue filter model which provide good matches with corresponding features of the corresponding digital filter model.

A 'match' is simply a frequency point at which some specific characteristic is known about the gain or phase, and at which the known characteristic is substantially identical in both the prototype and the digital filter.

A match is usually one of:

known gain at known frequency known rate of change of gain at known frequency but, in general, a match could rely on phase information, higher order derivatives of gain etc.

The matches which are selected are those unaffected by increasing the frequency of the filter towards or even above Nyquist frequency. Thus the matches which are preferably selected are a plurality of points on the filter characteristic at and below Nyquist frequency and above dc. In addition, dc may be selected.

This allows an EQ to have a peak frequency near to Nyquist frequency or an apparent peak above Nyquist Frequency, but remain realisable.

This allows both an EQ and a shelf to have a good match between the prototype analogue filter and the digital filter in the Nyquist range.

Shelf According to the Invention

The key to generating the shelf is to use features which are 'matched' when the pre-distorted shelf is warped.

There are five variables available in the shelf of Equation 3, $H_\infty$, $\omega_n$, $\omega_d$, $Q_n$ and $Q_d$). This means up to five matches can be achieved between the prototype and distorted shelf i.e. the shelf as distorted by the bilinear transform. (As a comparison, the bilinear transform generally achieves only two matches).

FIG. 6 shows the relationship of H, $\omega_n$ and $\omega_d$ to a shelf.

Once a match has been identified, it is pre-warped (i.e. the feature is moved in frequency according to the relationship given in Equation 2). This guarantees that the feature will be present at the correct frequency in the shelf resulting from the application of the bilinear transform (Equation 1).

In theory it is possible to generate matches at any frequency below Nyquist, where Nyquist frequency here means half the sampling frequency. However, some points are more convenient than others. The matches which are chosen for use in embodiments of the present invention are:

gain at dc and Nyquist frequency frequency at ¼·½ and ¼ Nyquist gain as shown in FIG. 7.

Constructing a Shelf

A pre-warped shelf will be constructed which will be certain of matching the prototype response at a plurality of points. The warped shelf will have the same form as Equation 3 with its parameters denoted without a subscript p, (i.e. $H_\infty$, $W_d$, $W_n$, $Q_n$, $Q_d$). These parameters will each be derived from the prototype filter response in order to ensure matching at a number of points on the response.

Nyquist Gain Constraint

One of the most important requirements of the distorted shelf is that, when warped, it has the same gain as the prototype at Nyquist frequency.

As a first step, the gain of the prototype shelf as a function of frequency needs to be found. For simplicity, the prototype shelf of Equation 3 is assumed to be symmetrical and critically damped. If the prototype shelf has a gain at infinity, $H_{\infty p}$, and half power frequency, $\omega_{0p}$, then gain at any frequency, $\omega_p$, is given by:

$$G_p = \sqrt{\frac{H_{\infty p}\omega_p^4 + \omega_{0p}^4}{\frac{\omega_p^4}{H_{\infty p}} + \omega_{0p}^4}} \quad \text{(Equation 5)}$$

for the shelf of Equation 3 ($\omega_{0p}$ is also the 'centre frequency' for a symmetrical shelf).

Equation 5 is based on the assumptions that:

$Q_{np} = Q_{dp} = 1/\sqrt{2}$—i.e. critical damping;

$(\omega_{np}/\omega_{dp})^2 = 1/H_{\infty p}$; and $\omega_{op}^2 = \omega_{np} \cdot \omega_{dp}$.

If the shelf has boost i.e. H, G>1, then this equation can be rearranged for $\omega$:

$$\omega_p = \omega_{0p}\left(\frac{H_{\infty p}(G_p^2 - 1)}{H_{\infty p}^2 - G_p^2}\right)^{\frac{1}{4}} \quad \text{(Equation 6)}$$

($H_{\infty p}$ and $\omega_{op}$ are in practice set by gain and frequency controls denoted by 6 and 8 in the Figures)

The Nyquist gain $H_n$ can be found simply by substituting $\omega = \pi F_s$ into Equation 5 where $F_s$ is the sampling frequency. At this point, the condition that the filter has unity gain at DC is applied. Referring to the 'standard shelf construction' outlined in Equation 3, it can be shown that for this to be the case:

$$\left(\frac{\omega_d}{\omega_n}\right)^2 = H_n \quad \text{(Equation 6a)}$$

Determining Frequency Components

There are three variables left to find: $Q_n$; $Q_d$; and either $\omega_n$ or $\omega_d$. In theory, it is possible to solve for these variables by matching the ¼, ½ and ¾ Nyquist gain points. However, these solutions are highly complex.

To get around this, an assumption is made that the resulting shelf is symmetrical (i.e. the Q components are equal). In practice, this is often a poor assumption (there can be up to an order of magnitude difference between the Q components), especially when the centre frequency of the shelf is high. However, it has been found that the frequency components are not strongly affected by shelf asymmetry, so this approximation is useful.

The assumption allows us to say that $\omega_n$ and $\omega_d$ satisfy the geometric mean property around the centre frequency $\omega_{0s}$ of the final shelf.

$$\omega_d \omega_n = \omega_{0s}^2 \quad \text{(Equation 7)}$$

where: $\omega_{0s}$) in Equation 7 is the centre frequency of the final shelf obtained by substituting $G = \sqrt{H_\infty}$ into Equation 6.

Interestingly, although the theory suggests that the centre frequency $\omega_{0s}$) should be pre-warped, it was found experimentally that it does not need to be. With hindsight, this can be rationalised by the fact that the resulting shelf will be stretched at HF, pushing the centre frequency up. This reduces the need for pre-warping (which would have pushed the centre frequency up).

Warp $\omega_{1pi}$ $\omega_{2p}$

Equation 6 is used to derive frequencies $\omega_{1p}$ and $\omega_{2p}$ from $H_n$ at the ½ and ¼ Nyquist gain points. Equation 2 is then applied to pre-warp $\omega_{1p}$ and $\omega_{2p}$ to values $\omega_1$ and $\omega_2$. Thus $\omega_1$ and $\omega_2$ are pre-warped values chosen so that once the bilinear transform is applied they match with the prototype.

Determining Q Components

For the shelf of Equation 3 with a specified $\omega_n$ and $\omega_d$ (whose response passes through points $\omega_1$ and $\omega_2$ with normalised gain $g_1$ and $g_2$ respectively) the Q components including the necessary pre-warping by Equation 2 are defined as:

$$Q_n = \omega_n \omega_1 \omega_2 \sqrt{\frac{g_1^2 - g_2^2}{g_2^2 \omega_2^2 (\omega_n^2 - \omega_1^2)^2 - g_1^2 \omega_1^2 (\omega_n^2 - \omega_2^2)^2 + g_1^2 g_2^2 (\omega_1^2 - \omega_2^2)(\omega_d^4 - \omega_1^2 \omega_2^2)}} \quad \text{(Equation 8)}$$

$$Q_d = \omega_d \omega_1 \omega_2 \sqrt{\frac{g_1^2 - g_2^2}{g_2^2 \omega_1^2 (\omega_d^2 - \omega_2^2)^2 - g_1^2 \omega_2^2 (\omega_d^2 - \omega_1^2)^2 + (\omega_2^2 - \omega_1^2)(\omega_n^4 - \omega_1^2 \omega_2^2)}} \quad \text{(Equation 9)}$$

[Normalised gain $g_n$ is defined as (linear gain at point/linear gain at infinity) i.e. $g_n = G_n/H_\infty$, where $G_n$ is gain at a point and $H_\infty$ is gain at infinity of the final filter.]

In theory, $\omega_1$ and $\omega_2$ can be any frequency but it is convenient to use the quarter and half Nyquist gain points. (Using the three quarter Nyquist gain point generally produces worse results). It is interesting to note that the half Nyquist gain point can be reused (it has already been used once to calculate the product of frequency components). This may seem analogous to attempting to solve for five unknowns using only four constraints. However, we know that the geometric mean relationship (Equation 7) used to calculate the frequency components was an approximation and therefore it counts as an independent constraint.

Assembling the Final Filter

Once the five parameters ($H_n$, $\omega_n$ $\omega_d$, $Q_n$, and $Q_d$) have been found, the shelf having the form of Equation 3 (but with its parameters replaced by $H_n$, $\omega_n$ $\omega_d$, $Q_n$, and $Q_d$) is subjected to a normal bilinear transform. The coefficients of the filter are then generated in known manner.

The improvement can be seen by comparing 16 kHz shelves designed by the conventional and the new techniques as shown in FIG. 8.

FIG. 8 illustrates:

the new method guarantees a gain match at Nyquist frequency the slope of the prototype is almost exactly replicated in the enhanced shelf, especially in the audible region there is no guarantee that the prototype centre frequency i.e. $W_{op}$ as set by the control 8 is matched

The Flexibility of the Solution

1. Although it has been assumed throughout that the prototype is a shelf, the equations are general. They can be used to generate an approximation to any gain response which has no turning points. The only change in procedure is to substitute the relevant gain/frequency relationships.

2. Because features which are important to the resulting shelf are chosen throughout (all frequencies have a relationship to the Nyquist gain), the technique also works for shelves which have their centre frequency outside the Nyquist range as shown in FIG. 9. FIG. 9 also shows a conventional shelf.

It is possible to design shelves with apparent centre frequencies in excess of 50 kHz, although these may have limited effect in the audible range. It has been found that the limiting factor is the precision of coefficient calculations. As the centre frequency rises, the Nyquist gain approaches 0dB and the algorithm becomes more sensitive to errors.

If the centre frequency of the shelf is limited to 20 kHz, double precision floating point math (which is employed in, for example, a DEC Alpha host) is more than sufficient to ensure that algorithmic instability does not occur.

Making Shelves With Cut

To find gain as a function of frequency, it was assumed that the shelf had boost (Equation 5). In order to use a uniform procedure for all shelves, if a shelf is required to have cut, its gain can be inverted to make it appear as if it is a boost shelf.

The shelf can be turned back to cut at the very end of the procedure taking the reciprocal 1/H of H, swapping $\omega_n$ and $\omega_d$ and swapping $Q_n$ and $Q_d$.

Regarding frequency, it has been assumed so far that shelves are specified by a prototype centre frequency $\omega_{0p}$ and a gain at infinity $H_{\infty p}$. However, it is possible to use a nominal −3 dB point as the reference frequency.

The centre frequency and nominal −3 dB point are then related by the expression $$\omega_{centre} = \frac{\omega_{-3 \text{ dB}}}{gain^{\frac{1}{4}}}$$

Overshoot

It is possible to provide an overshoot (or undershoot) characteristic in a shelf. To achieve this, the $Q_n$ and $Q_d$ parameters are modified according to an empirically determined law.

The centre frequency is placed at the geometric mean of the frequencies with no pre-warping and with full pre-warping. The helps reduce the gain drift in the model with no pre-warping.

Figure 11:
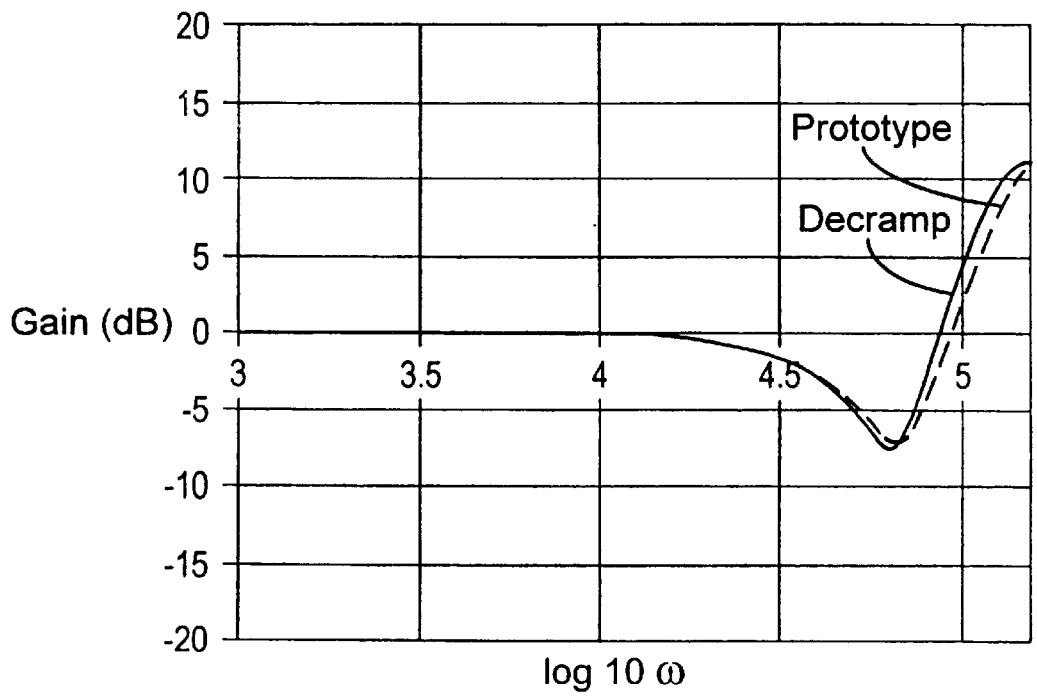

As shown in FIGS. 10 and 11, whilst the result is not perfect, the overshoot gain and frequency characteristics are acceptable. It is also important to note that, once the overshoot is non-zero, the only guaranteed matches to the prototype are at dc and Nyquist frequency.

An example of an overshoot law is:

$$Q_{nso} = Q_{ns} 10^{\phi H \infty \frac{P}{20}}$$

Where $Q_{nso}$ is the $Q_n$ in equation 3 with overshoot applied $Q_{ns}$ is the $Q_n$ in equation 3 without overshoot applied (i.e. as calculated from equation 8)

ø is an overshoot parameter which is greater than, or equal to, zero.

For systems requiring an overshoot control, it has been empirically observed that using a value of $\omega_{0s}$ in Equation 7 at the geometric mean of frequencies with no pre-warping and full pre-warping helps to reduce gain drift: i.e.

$$\omega_{temp} = \omega_0 \left( \frac{H\infty_p (H_\infty - 1)}{H_{\infty p}^2 - H_\infty} \right)^{\frac{1}{4}}$$

$$\omega_{temp} = \omega = 2Fs \tan\left( \frac{\omega_{temp}}{2Fs} \right)$$

-continued $$\omega_{os} = \sqrt{\omega_{temp}\omega_{tempW}}$$

Illustrative Filter System

Figure 12:
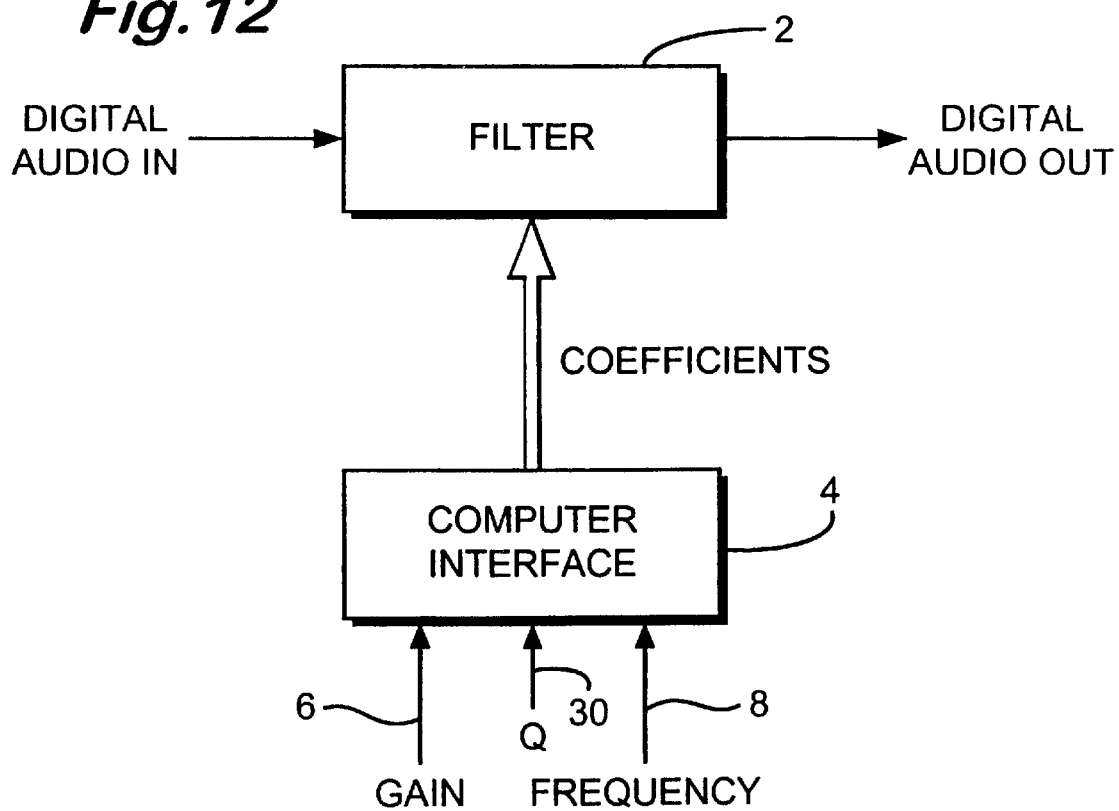
FIG. 12 is a schematic block diagram of a digital filter system.

Referring to FIG. 12, a digital filter system comprises a digital second order IIR filter 2 of known form, having an input in for receiving a digital audio signal sampled at a conventional digital audio sampling rate. The filter outputs a filtered signal at an output out.

A computer interface including for example a DEC Alpha (Trade Mark) computer 4 generates filter coefficients in dependence upon the setting of, inter alia, gain and frequency controls 6 and 8, and a Q control 30. The Q control is not used in generating a shelf except for providing overshoot or undershoot.

Figure 13:
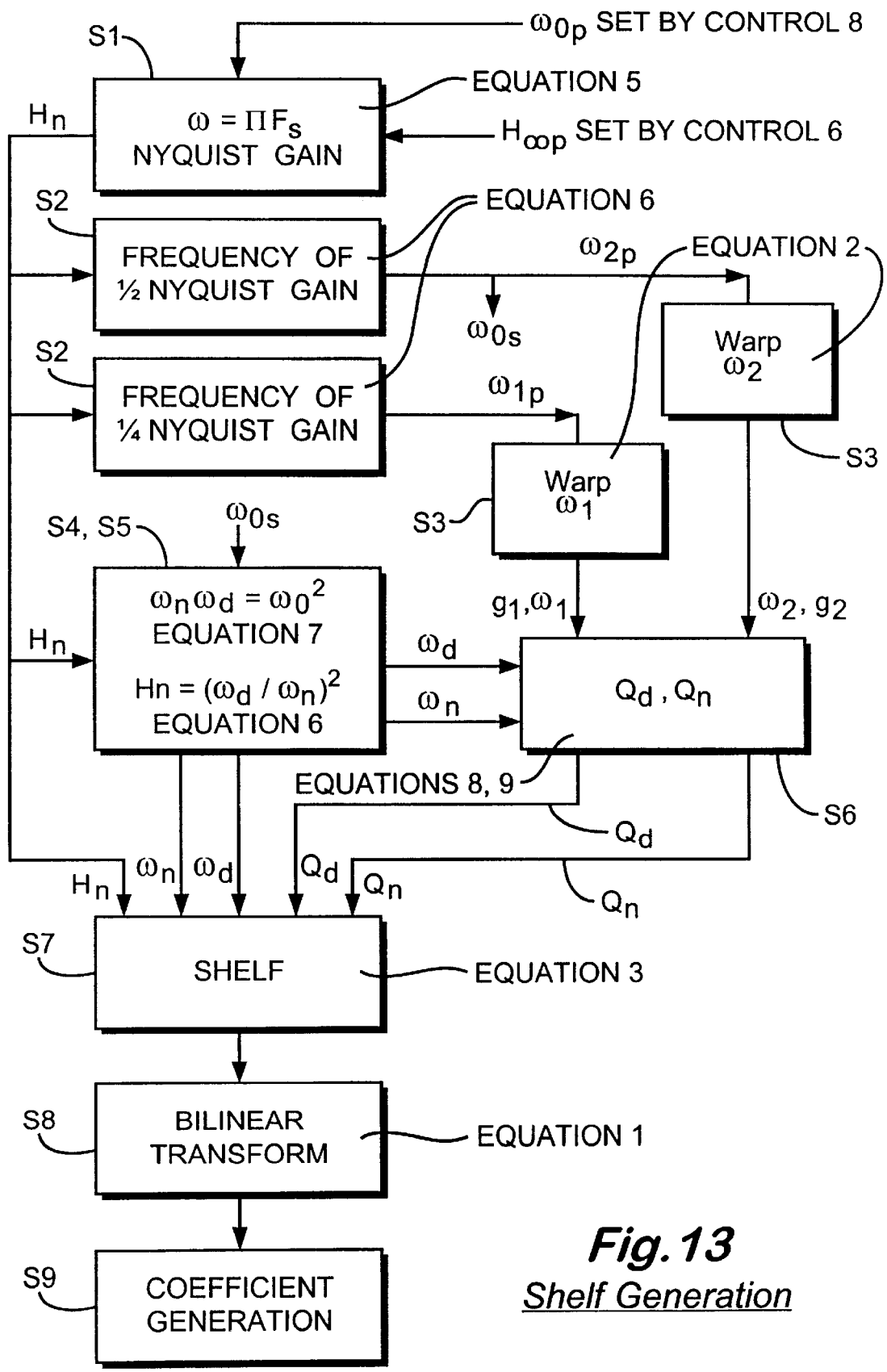
FIG. 13 is a chart illustrating the generation of filter coefficients for the filter of FIG. 10.

In this example, the filter 2 and the computer 4 implement a shelf according to the procedure shown in the chart of FIG. 13.

Referring to FIG. 13, the shape or frequency response of the shelf is defined by Equations 5 and 6 described above.

S1. The gain control 6 sets the prototype gain $H_{\infty p}$ of Equation 5, i.e. the gain at infinity. The prototype centre frequency $\omega_{0p}$ is set by the frequency control 8.

From Equation 5 the Nyquist gain Hn is calculated using the set values of $H_{\infty p}$, $\omega_{0p}$ and $\omega=\pi F_s$.

S2. From Equation 6, the frequencies $\omega_{1p}$ and $\omega_{2p}$ at which the shelf gain is $(H_n)^{1/4}$ and $(H_n)^{1/2}$ respectively are calculated, using $(H_n)^{1/4}$, $(H_n)^{1/2}$, $\omega_{0p}$ and $H_{\infty p}$.

Thus, $H_n$, $\omega_{1p}$ and $\omega_{2p}$ are determined from the known sampling frequency $F_s$ and from the settings of controls 6 and 8. The value of $\omega_{2p}$ may be used as the value of $\omega_{0s}$ of the final shelf: see equation 7 above.

S3. The values $\omega_{1p}$ and $\omega_{2p}$ (but not $\omega_{0s}$) are prewarped according to Equation 2.

S4–S6. The determined pre-warped values $\omega_1$, $\omega_2$ and the value $\omega_{0s}$ are then provided for the calculation of pre-warped values of $Q_n$, and $Q_d$, using Equations 6a, 7, 8 and 9. $\omega_n$ and $\omega_d$ are calculated using Equations 6 and 7 and the values $\omega_{0s}$ and $H_n$ calculated at steps S2 and S1. $\omega_n$ and $\omega_d$ are substituted into Equations 8 and 9 to calculate $Q_n$ and $Q_d$. As discussed, above $\omega_n$ and $\omega_d$ are based on an un-warped value of $\omega_{0s}$.

S7. The pre-warped values of $H_n$, $\omega_n$, $\omega_d$, $Q_d$ and $Q_n$ thus calculated are used to calculate a pre-warped shelf according to form of Equation 3, but with the pre-warped values applied.

S8. The pre-warped shelf is then subject to a bilinear transfer (Equation 1).

S9. Coefficients for the filter 2 are then generated in known manner.

Equaliser According to the Invention

Referring to FIG. 14 an example of an EQ is shown together with matching points for the derivation of filter coefficients. The chosen matches are: dc, lower half effect point, peak gain and Nyquist gain Such a matching scheme gives a higher priority to matching the response on the low frequency side of the peak gain. It might be thought that this would be a disadvantage if the peak gain is placed at low frequency. If the centre frequency is 1 kHz, then there are no matches between 1 kHz and Nyquist frequency and the response could be incorrect.

However, it can be shown that as the Nyquist gain approaches 0dB (as it will if the centre frequency is low), the response becomes symmetrical about the centre frequency (i.e. the match on the LF side also becomes a match on the high frequency side).

The Orfanidis method of filter design uses dc, peak gain, Nyquist gain and a bandwidth to specify the filter. The peak gain is actually two constraints—the gain at the centre frequency, and the derivative of gain at that frequency equal to zero. However, as the peak approaches the Nyquist frequency, the Nyquist gain condition becomes similar to the gain at centre frequency condition, and the bandwidth condition becomes similar to the derivative equal to zero condition. This causes the system of equations to become almost singular (ill-conditioned), and therefore highly sensitive. In the EQ of the present embodiment, the gain at centre frequency and Nyquist gain condition become similar as the centre frequency rises. However, the other conditions remain completely independent, and thus the system of equations does not approach a singularity as quickly.

A filter EQ is formed using the matches which have been identified above. The filter has a Nyquist gain of N and 0dB gain at dc. There are three unknowns to find, a, b and c in the prototype EQ transfer function.

$$H(s) = \frac{Ns^2 + 2F_s as + 4F_s^2 b}{s^2 + 2F_s cs + 4F_s^2 b} \quad \text{(Equation 10)}$$

where: $F_s$ is sampling frequency.

The desired filter has parameters:
centre frequency ($\omega_c$), radians per sample, where
radians per sample=(radians per second)/(samples per second);
peak gain (G); and
Q factor (Q)

To calculate the target coefficients, some intermediate variables are the Nyquist gain (N); lower half effect point ($\omega_1$) and several pre-warped quantities, denoted by a subscript w.

$$N = \sqrt{\frac{Q^2(\omega_c^2 - \pi^2)^2 + G^2\omega_c^2\pi^2}{Q^2(\omega_c^2 - \pi^2)^2 + \omega_c^2\pi^2}} \quad \text{(Equation 11)}$$

$$\omega_1 = \frac{\omega_c}{Q\sqrt{2}}\sqrt{G + 2Q^2 - \sqrt{G(G + 4Q^2)}} \quad \text{(Equation 12)}$$

$$\omega_{cw} = \tan\left(\frac{\omega_c}{2}\right) \quad \omega_{1w} = \tan\left(\frac{\omega_1}{2}\right) \quad \text{(Equations 13)}$$

$$b = \omega_{cw}^2 \sqrt{\frac{G^2 - N^2}{G^2 - 1}} \quad \text{(Equation 14)}$$

$$a = \sqrt{\frac{2b\left(N - \sqrt{\frac{G^2 - N^2}{G^2 - 1}}\right) + \omega_{1w}^2 G^2 \frac{1 - N^2}{G^2 - 1} +}{G\frac{G^2 - N^2}{G^2 - 1}\frac{(\omega_{cw}^2 - \omega_{1w}^2)^2}{\omega_{1w}^2}}} \quad \text{(Equation 15)}$$

$$c = \sqrt{\frac{2\omega_{cw}^2(G^2 - N^2) + \omega_{1w}^2(N^2 - G)}{G - G^2} + \frac{\omega_{cw}^{4} }{G\omega_{1w}^2}\frac{G^2 - N^2}{G^2 - 1} + 2b} \quad \text{(Equation 16)}$$

Referring to FIG. 12, the gain control 6 sets peak gain G and the frequency control 8 sets centre frequency $\omega_c$, and the Q control 30 sets Q.

Illustrative Filter System

Figure 17:
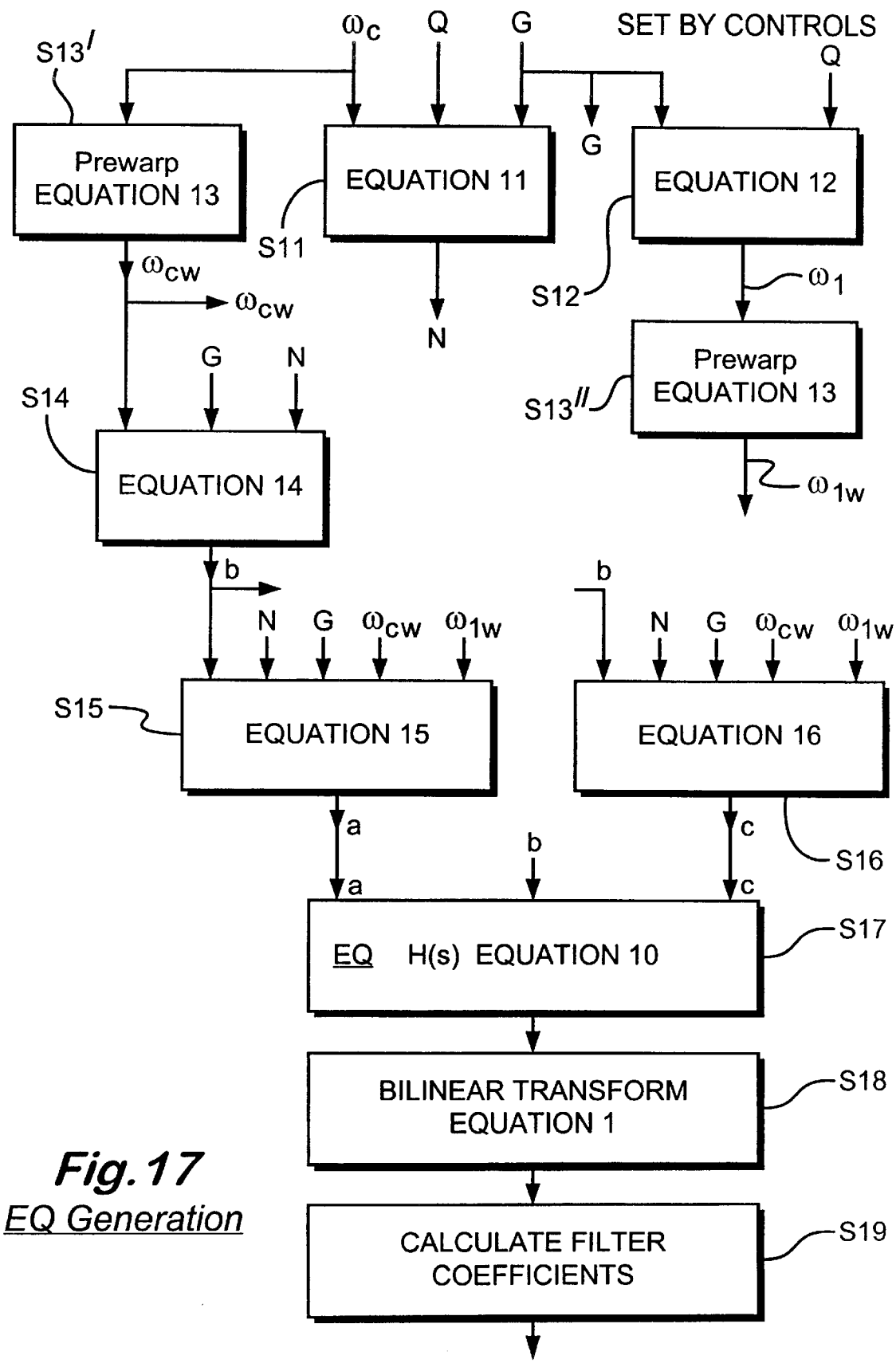
FIG. 17 is a chart illustrating the generation of filter coefficients for an EQ.

An illustrative filter system is shown in FIG. 12 which is described hereinabove. The system operates as follows, referring to FIG. 17.

S11. The Nyquist gain N is calculated from Equation 11 according to the EQ prototype above, based on the settings of Q, G and $\omega_c$ defined by the controls 30, 6 and 8 in FIG. 12.

S12. The lower half effect point $\omega_1$ is calculated from Equation 12.

S13. The centre $\omega_c$ and lower half effect $\omega_1$ frequencies are pre-warped according to Equation 13.

S14. 'b' is calculated from Equation 14.

S15. 'a' is calculated from Equation 15.

S16. 'c' is calculated from Equation 16.

S17. The pre-warped analogue equalisation characteristic H(s) is calculated according to Equation 10.

S18. The bilinear transform is then applied to H(s).

S19. The filter coefficients are calculated in known manner and applied to the filter.

Common Transfer Function for EQ and Shelf

The prototype shelf was described in general terms (as in Equation 3). However, because it has 0dB gain at dc, it can be rearranged into the same form as the EQ:

$$shelf = \frac{H\left(s^2 + s\frac{\omega_n}{Q_n} + \omega_n^2\right)}{s^2 + s\frac{\omega_d}{Q_d} + \omega_d^2} \quad \text{(Equation 17)}$$

$$EQ = \frac{Ns^2 + as + b}{s^2 + cs + b} \quad \text{(Equation 18)}$$

But if N=H, $a = H \times \omega_n/Q_n$, $b = \omega_d^2$, (noting that $H\omega_n^2 = \omega_d^2$), $c = \omega_d/Q_d$ then the same transfer function can be used for the EQ and the shelf. This presents real benefit in a real-time processing system.

Combining Shelf and EQ

As the EQ is shifted higher in frequency its peak approaches and passes the Nyquist frequency. The EQ is defined by matching frequency points equal to and less than Nyquist frequency and thus the EQ remains stable below and near to Nyquist frequency but not beyond. However as the EQ peak moves above Nyquist frequency it resembles a shelf and, in accordance with an aspect of the present invention, it is recognised that it is desirable to replace the EQ with a matching shelf.

The shelf portion of the EQ provides a prototype of the desired shelf. The shelf is then produced in the same way as described hereinbefore but with the EQ as a prototype for the shelf.

The EQ gain/frequency characteristics are:

$$\lambda^2 = \frac{Q^2(\omega_0^2 - \omega^2)^2 + (G_p\omega - \omega_0)^2}{Q^2(\omega_0^2 - \omega^2)^2 + (\omega\omega_0)^2} \quad \text{(Equation 19)}$$

$$\left(\frac{\omega}{\omega_0}\right)^2 = 1 + \frac{G_p^2 - \lambda^2 \pm \sqrt{(2Q^2(1-\lambda^2) - G^2 + \lambda^2)^2 - 4Q^4(\lambda^2-1)^2}}{2Q^2(\lambda^2 - 1)} \quad \text{(Equation 20)}$$

where: $\lambda$ is gain; $G_p$ is the peak gain of the EQ; $\omega_0$ is the centre frequency; $\omega$ is frequency and Q is Q factor.

FIG. 15 illustrates a comparison of an example of an EQ and a matching shelf.

They do not exactly match because they have very different pole-zero configurations.

The EQ is replaced by the shelf in the following manner.

A transition frequency is defined in software in the interface 4. The control frequency set by control 8 is compared with the transition frequency. If control frequency is higher than the transition frequency the EQ is replaced by the shelf.

Figure 16:
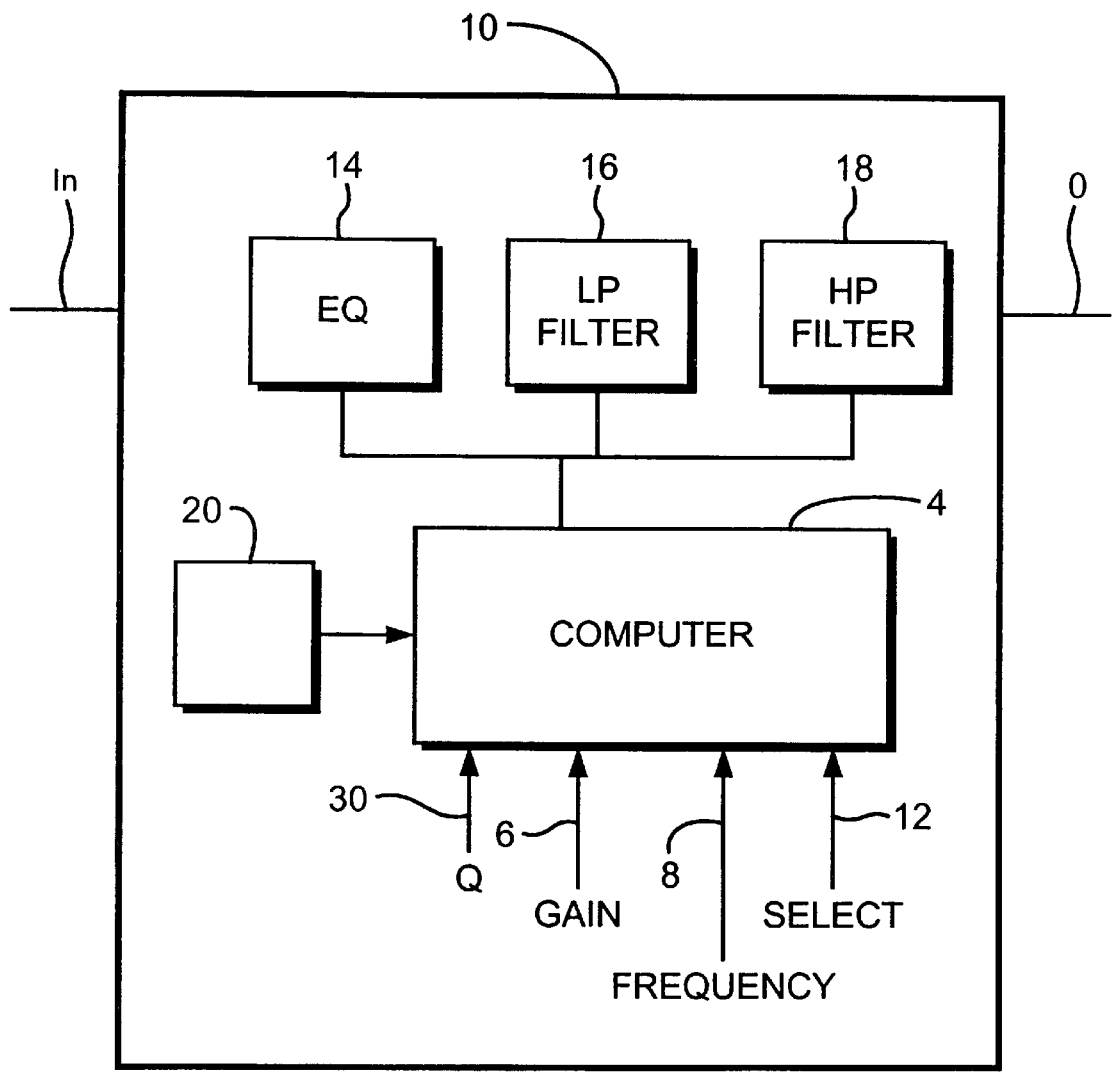
FIG. 16 is a schematic block diagram of an audio mixer.

FIG. 16 shows schematically an audio mixer 10, having an equalisation (EQ) section 14, a Low Pass filter section 16 and a high pass filter section 18 controlled by a computer interface 4. The interface receives gain control 6 and frequency control signals. It also allows selection of the filter sections 14, 16, 18. Any of the sections may be connected to the input and output signals singly or in combination.

Other features conventional in a mixer are not shown. The algorithms for controlling the filter sections may be provided on a data carrier 20, such as a CD-ROM, floppy disc or other conventional form of record or memory. The carrier is loaded into the computer interface 4 which may include a standard computer such as a DEC Alpha (trademark) for implementing the algorithms.

A computer (e.g. 4 in FIG. 16) may be used "off-line" to calculate the filter coefficients which are compiled into, for example, a look-up table. The filter 14, 16 or 18 may use the look-up table instead of calculating the coefficients in "real-time".

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A method of generating coefficients in a digital filter, comprising the steps of:
    (a) providing a gain control signal setting a value of reference gain,
    (b) providing a frequency control signal setting a value of reference frequency
    (c) calculating, according to a model of the frequency/gain characteristic of a prototype analogue filter, a plurality of gain and/or frequency points at frequencies equal to and less than Nyquist frequency (where Nyquist frequency is half the sampling frequency of the digital filter) and which match corresponding gain and/or frequency points in the corresponding digital filter characteristic,
    (d) calculating from the said calculated points, pre-warped parameters of a model of the analogue filter,
    (e) applying a transform to the resulting pre-warped analogue model to convert the pre-warped analogue model to the digital domain and
    (f) generating filter coefficients from the transformed model and applying them to the filter.

2. A method according to claim 1, wherein the gain control signal sets the value of gain at infinite frequency as the reference frequency.

3. A method according to claim 2, wherein the frequency control signal sets the value of frequency at centre frequency.

4. A method according to claim 3, wherein step c) comprises calculating the Nyquist gain at the Nyquist frequency, where Nyquist frequency is half the sampling frequency of the digital filter.

5. A method according to claim 4, wherein step c) comprises calculating the frequencies at respective ones of a plurality of predetermined proportions of the Nyquist gain.

6. A method according to claim 5, wherein step d) comprises warping calculated frequency values of predetermined proportions of the Nyquist gain.

7. A method according to claim 6, wherein the filter is a shelf and the said model of the prototype analogue filter is $$shelf = \frac{H_{\infty p}\left(s^2 + s\frac{\omega_{np}}{Q_{np}} + \omega_{np}^2\right)}{s^2 + s\frac{\omega_{dp}}{Q_{dp}} + \omega_{dp}^2}. \quad \text{(Equation 3)}$$

where:

$\omega_{np}$ is a zero frequency;

$\omega_{dp}$ is a pole frequency;

$Q_{np}$ is a measure of zero damping;

$Q_{dp}$ is a measure of pole damping;

$H_{\infty p}$ is Gain at infinity (reference frequency).

8. A method according to claim 7, wherein $$\omega_d \omega_n = \omega_{0s}^2 \quad \text{(Equation 7)}$$

where $\omega_{0s}$ is the centre frequency of the final digital filter.

9. A method according to claim 8, wherein an un-warped value of the frequency of one of the said predetermined proportions of the Nyquist frequency is used as $\omega_{0s}$.

10. A method according to claim 9, wherein in step c) the Nyquist frequency $H_n$ is calculated using the equation:

$$G_p = \sqrt{\frac{H_{\infty p}\omega_p^4 + \omega_{0p}^4}{\frac{\omega_p^4}{H_{\infty p}} + \omega_{0p}^4}} \quad \text{(Equation 5)}$$

where $G_p$=gain, $\omega_p$ =frequency, $H_{\infty p}$ is the gain at infinite frequency set by the gain control signal and $\omega_{0p}$ is the centre frequency of the prototype filter set by the frequency control signal and $\omega_p = \pi F_s$.

11. A method according to claim 10, wherein step d) comprises calculating values $\omega_n$ and $\omega_d$ from $\omega_d\omega_n=\omega_{0s}^2$ and $H_n=(\omega_d/\omega_n)^2$.

12. A method according to claim 11 wherein step d) comprises calculating $$Q_n = \omega_n\omega_1\omega_2 \sqrt{\frac{g_1^2 - g_2^2}{g_2^2\omega_2^2(\omega_n^2 - \omega_1^2)^2 - g_1^2\omega_1^2(\omega_n^2 - \omega_2^2)^2 + g_1^2g_2^2(\omega_1^2 - \omega_2^2)(\omega_d^4 - \omega_1^2\omega_2^2)}} \quad \text{(Equation 8)}$$

and $$Q_d = \omega_d\omega_1\omega_2 \sqrt{\frac{g_1^2 - g_2^2}{g_2^2\omega_1^2(\omega_d^2 - \omega_2^2)^2 - g_1^2\omega_2^2(\omega_d^2 - \omega_1^2)^2 + (\omega_2^2 - \omega_1^2)(\omega_n^4 - \omega_1^2\omega_2^2)}} . \quad \text{(Equation 9)}$$

13. A method according to claim 12 wherein the step e) comprises applying $H_n$, $\omega_n$, $\omega_d$, $Q_n$, and $Q_d$ $$\text{to } shelf = \frac{H_{\infty p}\left(s^2 + s\frac{\omega_{np}}{Q_{np}} + \omega_{np}^2\right)}{s^2 + s\frac{\omega_{dp}}{Q_{dp}} + \omega_{dp}^2}.$$

14. A method according to claim 13, wherein the said transform of step e) is a bilinear transform.

15. A computer program product arranged to implement the method of claim 1, when run on a computer.

16. A recording medium in which is stored a computer program product arranged to implement the method of claim 1, when run on a computer.

17. A method according to claim 1, wherein the filter is an EQ and the said model of the prototype filter is:

$$H(s) = \frac{Ns^2 + 2F_s as + 4F_s^2 b}{s^2 + 2F_s cs + 4F_s^2 b} \quad \text{(Equation 10)}$$

where: $F_s$ is sampling frequency and N is Nyquist gain, and a, b, and c, are filter parameters.

18. A method according to claim 17, wherein step c) comprises calculating $$\omega_1 = \frac{\omega_c}{Q\sqrt{2}} \sqrt{G + 2Q^2 - \sqrt{G(G + 4Q^2)}} . \quad \text{(Equation 12)}$$

19. A method according to claim 17, wherein the said step c) comprises calculating a value of Nyquist gain according to $$N = \sqrt{\frac{Q^2(\omega_c^2 - \pi^2)^2 + G^2\omega_c^2\pi^2}{Q^2(\omega_c^2 - \pi^2)^2 + \omega_c^2\pi^2}} \quad \text{(Equation 11)}$$

where centre frequency ($\omega_c$), radians per sample, peak gain (G); and

Q factor (Q).

20. A method according to claim 19, wherein step c) comprises using the centre frequency unchanged.

21. A method according to claim 20, wherein step d) comprises calculating pre-warped values $$\omega_{cw} = \tan\left(\frac{\omega_c}{2}\right) \quad \omega_{1w} = \tan\left(\frac{\omega_1}{2}\right). \quad \text{(Equations 13)}$$

22. A method according to claim 21, wherein step d) further comprises calculating $$b = \omega_{cw}^2 \sqrt{\frac{G^2 - N^2}{G^2 - 1}}.$$ (Equation 14)

23. A method according to claim 22, wherein step d) comprises calculating $$a = \sqrt{2b\left(N - \sqrt{\frac{G^2 - N^2}{G^2 - 1}}\right) + \omega_{1w}^2 G^2 \frac{1 - N^2}{G^2 - 1} + G\frac{G^2 - N^2}{G^2 - 1} \frac{(\omega_{cw}^2 - \omega_{1w}^2)^2}{\omega_{1w}^2}}$$ (Equation 15)

and $$c = \sqrt{\frac{2\omega_{cw}^2(G^2 - N^2) + \omega_{1w}^2(N^2 - G)}{G - G^2} + \frac{\omega_{cw}^4}{G\omega_{1w}^2} \frac{G^2 - N^2}{G^2 - 1} + 2b}.$$ (Equation 16)

24. A method according to claim 23, wherein step e) comprises applying N and the pre-warped values a, b, and c to $$H(s) = \frac{Ns^2 + 2F_s as + 4F_s^2 b}{s^2 + 2F_s cs + 4F_s^2 b}$$ (Equation 10)

where: $F_s$ is sampling frequency and N is Nyquist gain, and a, b, and c are filter parameters.

25. A digital filtering system comprising a digital filter (2) having an input for receiving a digital signal, and an output, an input (6) for receiving a gain control signal, an input (8) for receiving a frequency control signal, and
   an interface (4) responsive to the gain and frequency control signals to apply coefficients to the digital filter, the interface calculating the coefficients according to the steps of
   c) calculating, according to a model of the frequency/gain characteristic of a prototype analogue filter, a plurality of gain and/or frequency points at frequencies equal to and less than Nyquist frequency (where Nyquist frequency is half the sampling frequency of the digital filter) and which match corresponding gain and/or frequency points in the corresponding digital filter characteristic,
   d) calculating from the said calculated points, pre-warped parameters of a model of the analogue filter,
   e) applying a transform to the resulting pre-warped analogue model to convert the pre-warped analogue model to the digital domain and
   f) generating further coefficients from the transformed model and applying them to the filter.

26. A system according to claim 25, wherein the said transform of step e) is a bilinear transform.

27. A system according to claim 25, wherein step c) comprises calculating the Nyquist gain at the Nyquist frequency, where Nyquist frequency is half the sampling frequency of the digital filter.

28. A system according to claim 27, wherein step c) comprises calculating the frequencies at respective ones of a plurality of predetermined proportions of the Nyquist gain.

29. A system according to claim 28, wherein step d) comprises warping calculated frequency values of predetermined proportions of the Nyquist gain.

30. A system according to claim 29, wherein the filter is a shelf and the said model of the prototype analogue filter is $$\text{shelf} = \frac{H_{\infty p}\left(s^2 + s\frac{\omega_{np}}{Q_{np}} + \omega_{np}^2\right)}{s^2 + s\frac{\omega_{dp}}{Q_{dp}} + \omega_{dp}^2}$$ (Equation 3)

where:
   $\omega_{np}$ is a zero frequency;
   $\omega_{dp}$ is a pole frequency;
   $Q_{np}$ is a measure of zero damping;
   $Q_{dp}$ is a measure of pole damping;
   $H_{\infty p}$ is Gain at infinity (reference frequency).

31. A system according to claim 30, wherein $$\omega_d \omega_n = \omega_{0s}^2$$ (Equation 7)

where $\omega_{0s}$ is the centre frequency of the final digital filter.

32. A method according to claim 31, wherein an un-warped value of the frequency of one of the said predetermined proportions of the Nyquist frequency is used as $\omega_{0s}$.

33. A system according to claim 32, wherein in step c) the Nyquist frequency $H_n$ is calculated using the equation:

$$G_p = \sqrt{\frac{H_{\infty p}\omega_p^4 + \omega_{0p}^4}{\frac{\omega_p^4}{H_{\infty p}} + \omega_{0p}^4}}$$ (Equation 5)

where $G_p$=gain, $\omega_p$=frequency, $H_{\infty p}$ is the gain at infinite frequency set by the gain control signal and $\omega_{0p}$ is the centre frequency of the prototype filter set by the frequency control signal and $\omega_p = \pi F_s$.

34. A system according to claim 33, wherein step d) comprises calculating values $\omega_n$ and $\omega_d$ from $\omega_d \omega_n = \omega_{0s}^2$ and $H_n = (\omega_d/\omega_n)^2$.

35. A system according to claim 34, wherein step d) comprises calculating $$Q_n = \omega_n \omega_1 \omega_2 \sqrt{\frac{g_1^2 - g_2^2}{g_2^2 \omega_2^2(\omega_n^2 - \omega_1^2)^2 - g_1^2 \omega_1^2(\omega_n^2 - \omega_2^2)^2 + g_1^2 g_2^2(\omega_1^2 - \omega_2^2)(\omega_d^4 - \omega_1^2 \omega_2^2)}}$$ (Equation 8)

and $$Q_d = \omega_d \omega_1 \omega_2 \sqrt{\frac{g_1^2 - g_2^2}{g_2^2 \omega_1^2(\omega_d^2 - \omega_2^2)^2 - g_1^2 \omega_2^2(\omega_d^2 - \omega_1^2)^2 + (\omega_2^2 - \omega_1^2)(\omega_n^4 - \omega_1^2 \omega_2^2)}}.$$

(Equation 9)

36. A system according to claim 35 wherein the step e) comprises applying $H_n$, $\omega_n$, $\omega_d$, $Q_n$, and $Q_d$ $$\text{to shelf} = \frac{H_{\infty p}\left(s^2 + s\frac{\omega_{np}}{Q_{np}} + \omega_{np}^2\right)}{s^2 + s\frac{\omega_{dp}}{Q_{dp}} + \omega_{dp}^2}.$$

37. A data carrier carrying an algorithm for use in a digital filtering system, the algorithm implementing the steps of:
calculating, according to a model of the frequency/gain characteristic of a prototype analogue filter, a plurality of gain and/or frequency points at frequencies equal to and less than Nyquist frequency (where Nyquist frequency is half the sampling frequency of the digital filter) and which match corresponding gain and/or frequency points in the corresponding digital filter characteristic,
calculating from the said calculated points, pre-warped parameters of a model of the analogue filter,
applying a transform to the resulting pre-warped analogue model to convert the pre-warped analogue model to the digital domain and
generating further coefficients from the transformed model and applying them to the filter.

38. A method of generating coefficients for a digital filter comprising:
a) providing a gain control signal setting a value of reference gain,
(b) providing a frequency control signal setting a value of reference frequency
(c) calculating, according to a model of the frequency/gain characteristic of a prototype analogue filter, a plurality of gain and/or frequency points at frequencies equal to and less than Nyquist frequency (where Nyquist frequency is half the sampling frequency of the digital filter) and which match corresponding gain and/or frequency points in the corresponding digital filter characteristic,
(d) calculating from the said calculated points, pre-warped parameters of a model of the analogue filter,
(e) applying a transform to the resulting pre-warped analogue model to convert the pre-warped analogue model to the digital domain and
(f) generating filter coefficients from the transformed model.

39. A digital filter containing a store storing filter coefficients, the coefficients being generated in accordance with the method of claim 38.

40. A digital filter operating according to the method of claim 38.

41. A computer program product arranged to implement the method of claim 38 when run on a computer.

42. A recording medium in which is stored a computer program product arranged to implement the method of claim 38 when run on a computer.

43. A digital filter system comprising:
means for generating a first filter characteristic over a first range of frequencies, said first range of frequencies having a zone of algorithmic instability; and
means for generating a second filter characteristic over a second range of frequencies when a frequency represented by an inputted frequency control signal approaches the zone of algorithmic instability of the first filter characteristic,
whereby the second filter characteristic substantially matches a predetermined portion of the first filter characteristic and is algorithmically stable in the frequency zone of algorithmic instability of the first filter characteristic.

44. A filter system according to claim 43, wherein the said reference frequency is the Nyquist frequency where the Nyquist frequency is half the sampling rate of the filter.

45. A system according to claim 43, wherein the second characteristic replaces the portion of the first characteristic below the reference frequency.

46. A system according to claim 43, wherein the first characteristic is an equalisation characterisation and the second characteristic is a shelf.

47. A digital filter system comprising:
a digital filter,
an input for receiving a gain control signal,
an input for receiving a frequency control signal,
an interface, responsive to the gain and frequency control signals, for generating filter coefficients for the digital filter,
the interface being operative to
a) generate a first set of coefficients defining a first filter characteristic over a first range of frequencies in accordance with the frequency control signal, and
b) generate a second set of coefficients defining a second filter characteristic over a second range of frequencies in accordance with the frequency control signal when the frequency represented by the frequency control signal is equal to or greater than a reference frequency,
whereby the second filter characteristic substantially matches the first characteristic at and below the reference frequency.

48. A method of generating coefficients in a digital filter comprising the steps of:
receiving a gain control signal,
receiving a frequency control signal,
generating filter coefficients for the digital filter in response to the gain and frequency control signals,
generating a first set of coefficients defining a first filter characteristic over a first range of frequencies in accordance with the frequency control signal, and
generating a second set of coefficients defining a second filter characteristic over a second range of frequencies in accordance with the frequency control signal when the frequency represented by the frequency control signal is equal to or greater than a reference frequency,
whereby the second filter characteristic substantially matches the first characteristic at and below the reference frequency.

49. A data carrier carrying an algorithm for use in a digital filtering system, the algorithm implementing the steps of:

receiving a gain control signal, receiving a frequency control signal, generating filter coefficients for the digital filter in response to the gain and frequency control signals, generating a first set of coefficients defining a first filter characteristic over a first range if frequencies in accordance with the frequency control signal, and generating a second set of coefficients defining a second filter characteristic over a second range of frequencies in accordance with the frequency control signal when the frequency represented by the frequency control signal is equal to or greater than a reference frequency, whereby the second filter characteristic substantially matches the first characteristic at and below the reference frequency.

50. A computer program product arranged to carry out the method of claim 49 when run on a computer.

51. A data carrier carrying a computer program product arranged to carry out the method of claim 49 when run on a computer.

52. A method of generating coefficients in a digital filter to emulate an equalisation characteristic, comprising the steps of:

(a) providing a gain control signal setting a value of peak gain G, (b) providing a frequency control signal setting a value of center frequency $\omega_c$, (c) calculating, according to a model of the frequency/gain characteristic of a prototype analogue equalisation characteristic, Nyquist gain Hn, and lower half effect frequency $\omega_1$ and which match corresponding gain and/or frequency points in the corresponding digital filter characteristic, (d) calculating pre-warped values $\omega_{cw}$, $\omega_{1w}$, of $\omega_c$ and $\omega_1$, (e) calculating from Hn, G, $\omega_{cw}$, and $\omega_{1w}$ a pre-warped model of the digital filter characteristic, (f) applying a transform to the resulting pre-warped analogue model to convert the pre-warped analogue model to the digital domain, and (g) generating filter coefficients from the transformed model and applying them to the filter.

53. A filter system arranged to carry out the method of claim 52.

54. A method of generating coefficients for use in a digital filter to emulate an equalisation characteristic, comprising the steps of:

(a) providing a gain control signal setting a value of peak gain G, (b) providing a frequency control signal setting a value of center frequency $\omega_c$, (c) calculating, according to a model of the frequency/gain characteristic of a prototype analogue equalisation characteristic, Nyquist gain Hn, and lower half effect frequency $\omega_1$ and which match corresponding gain and/or frequency points in the corresponding digital filter characteristic, (d) calculating pre-warped values $\omega_{cw}$, $\omega_{1w}$, of $\omega_c$ and $\omega_1$, (e) calculating from Hn, G, and $\omega_{cw}$, and $\omega_{1w}$ a pre-warped model of the digital filter characteristic, (f) applying a transform to the resulting pre-warped analogue model to convert the pre-warped analogue model to the digital domain, and (g) generating filter coefficients from the transformed model.

55. A data carrier carrying an algorithm arranged to carry out the method of claim 52.

* * * * *